(12) United States Patent
Kamikawa et al.

(10) Patent No.: US 12,046,695 B2
(45) Date of Patent: Jul. 23, 2024

(54) METHOD OF REMOVING A SUBSTRATE

(71) Applicant: THE REGENTS OF THE UNIVERSITY OF CALIFORNIA, Oakland, CA (US)

(72) Inventors: Takeshi Kamikawa, Santa Barbara, CA (US); Srinivas Gandrothula, Santa Barbara, CA (US); Hongjian Li, Goleta, CA (US); Daniel A. Cohen, Santa Barbara, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 233 days.

(21) Appl. No.: 16/608,071

(22) PCT Filed: May 7, 2018

(86) PCT No.: PCT/US2018/031393
§ 371 (c)(1),
(2) Date: Oct. 24, 2019

(87) PCT Pub. No.: WO2018/204916
PCT Pub. Date: Nov. 8, 2018

(65) Prior Publication Data
US 2020/0194615 A1 Jun. 18, 2020

Related U.S. Application Data

(60) Provisional application No. 62/502,205, filed on May 5, 2017.

(51) Int. Cl.
*H01L 33/00* (2010.01)
*H01L 21/02* (2006.01)
(Continued)

(52) U.S. Cl.
CPC ...... *H01L 33/0093* (2020.05); *H01L 25/0753* (2013.01); *H01L 33/0075* (2013.01);
(Continued)

(58) Field of Classification Search
CPC ............ H01L 33/0093; H01L 33/0075; H01L 25/0753; H01L 33/007; H01L 21/02642;
(Continued)

(56) References Cited

U.S. PATENT DOCUMENTS 6,100,166 A   8/2000  Sakaguchi et al.
6,252,261 B1  6/2001  Usui et al.
(Continued)

FOREIGN PATENT DOCUMENTS

CN   101262118 A   9/2008
CN   101752487 A   6/2010
(Continued)

OTHER PUBLICATIONS

Supplementary European Search Report dated Dec. 4, 2020 for EP Application No. 18794585.2.
(Continued)

*Primary Examiner* — Sophia T Nguyen
*Assistant Examiner* — Scott E Bauman
(74) *Attorney, Agent, or Firm* — Gates & Cooper LLP

(57) ABSTRACT

A method of removing a substrate, comprising: forming a growth restrict mask with a plurality of striped opening areas directly or indirectly upon a GaN-based substrate; and growing a plurality of semiconductor layers upon the GaN-based substrate using the growth restrict mask, such that the growth extends in a direction parallel to the striped opening areas of the growth restrict mask, and growth is stopped before the semiconductor layers coalesce, thereby resulting in island-like semiconductor layers. A device is processed for each of the island-like semiconductor layers. Etching is
(Continued)

performed until at least a part of the growth restrict mask is exposed. The devices are then bonded to a support substrate. The GaN-based substrate is removed from the devices by a wet etching technique that at least partially dissolves the growth restrict mask. The GaN substrate that is removed then can be recycled.

18 Claims, 16 Drawing Sheets

(51) Int. Cl.
    *H01L 25/075*     (2006.01)
    *H01S 5/02*     (2006.01)
    *H01S 5/343*     (2006.01)

(52) U.S. Cl.
    CPC ........ *H01S 5/0217* (2013.01); *H01S 5/34333* (2013.01); *H01L 21/0254* (2013.01); *H01L 21/02647* (2013.01); *H01S 2304/12* (2013.01)

(58) Field of Classification Search
    CPC ........... H01L 21/02647; H01L 21/0254; H01L 21/6835; H01L 2221/68318; H01S 5/0217; H01S 5/34333; H01S 2304/12
    See application file for complete search history.

(56) References Cited

U.S. PATENT DOCUMENTS

| | | | |
|---|---|---|---|
| 6,855,571 B1 | 2/2005 | Sugahara et al. | |
| 7,351,300 B2 | 4/2008 | Takayama et al. | |
| 7,372,077 B2* | 5/2008 | Hata | H01S 5/04253 |
| | | | 257/98 |
| 8,283,677 B2* | 10/2012 | Takizawa | H01L 21/02639 |
| | | | 438/42 |
| 9,466,759 B2* | 10/2016 | Hertkorn | H01L 21/02458 |
| 2002/0152952 A1 | 10/2002 | Beaumont et al. | |
| 2004/0057482 A1 | 3/2004 | Wang | |
| 2006/0084245 A1 | 4/2006 | Kohda | |
| 2006/0220042 A1 | 10/2006 | Yaegashi et al. | |
| 2007/0164306 A1 | 7/2007 | Nakahata et al. | |
| 2007/0292979 A1* | 12/2007 | Hata | H01L 21/02458 |
| | | | 257/E21.127 |
| 2008/0163814 A1 | 7/2008 | Kim et al. | |
| 2008/0191192 A1* | 8/2008 | Feezell | B82Y 20/00 |
| | | | 257/E33.005 |
| 2008/0219309 A1 | 9/2008 | Hata et al. | |
| 2009/0098343 A1 | 4/2009 | Arena et al. | |
| 2010/0289189 A1 | 11/2010 | Lichtensteiger et al. | |
| 2012/0280363 A1* | 11/2012 | Sumida | H01L 21/0237 |
| | | | 257/E29.089 |
| 2012/0309269 A1 | 12/2012 | Khayyat et al. | |
| 2015/0069418 A1* | 3/2015 | Heo | H01L 21/02664 |
| | | | 257/79 |
| 2015/0270434 A1* | 9/2015 | Hertkorn | H01L 33/14 |
| | | | 438/46 |
| 2015/0318168 A1* | 11/2015 | Bayram | H01L 21/0217 |
| | | | 438/478 |
| 2015/0318436 A1* | 11/2015 | Heo | H01L 33/20 |
| | | | 438/46 |
| 2015/0340223 A1* | 11/2015 | Wunderer | H01L 29/8613 |
| | | | 438/492 |
| 2016/0197227 A1 | 7/2016 | Forrest et al. | |
| 2017/0077672 A1 | 3/2017 | Sakata et al. | |
| 2017/0236807 A1 | 8/2017 | Hwang et al. | |
| 2023/0335400 A1* | 10/2023 | Masaki | H01L 21/02389 |
| 2024/0072198 A1* | 2/2024 | Kamikawa | H01L 21/02664 |

FOREIGN PATENT DOCUMENTS

| | | |
|---|---|---|
| CN | 104221170 A | 12/2014 |
| CN | 103730544 B | 12/2017 |
| CN | 104733365 B | 11/2018 |
| JP | 2000349338 A | 12/2000 |
| JP | 2008252069 A | 10/2008 |
| JP | 2013251304 A | 12/2013 |
| JP | 2013251394 A | 12/2013 |
| JP | 5561489 | 7/2014 |
| WO | 2019055936 | 3/2019 |
| WO | 2019232230 | 12/2019 |

OTHER PUBLICATIONS

PCT International Search Report & Written Opinion Jul. 30, 2018, PCT Application No. PCT/US18/31393.
PCT International Search Report & Written Opinion Nov. 20, 2018, PCT Application No. PCT/US18/51375.
PCT International Search Report & Written Opinion Aug. 16, 2019, PCT Application No. PCT/US19/34686.
Zytkiewicz, Z.R., "Epitaxial Lateral Overgrowth—A Tool for Dislocation Blockade in MultilayerSystems," Acta Physica Polonica, 1998, 94, 2; Abstract and Introduction. (https://www.researchgate.net/profile/Z_Zytkiewicz/publication/283383446_Epitaxial_Lateral_Overgrowth_a_Tool_for_Dislocation_Blockade_in_Multilayer_Systems/links/5717995508ae886b89834468/Epitaxial-Lateral-Overgrowth-a-Tool-for-Dislocation-Blockade-in-Multilayer-Systems.pdf).
Bedell et al., "Layer Transfer by Controlled Spalling." J. Phys. D.: Appl. Phys., 2013, 46, 15, p. 1-6; entire document, (https://iopscience.iop.org/article/10.1088/0022-3727/46/15/152002/pdf).
European Communication pursuant to Article 94(3) EPC dated Dec. 2, 2022 for European Application No. 18794585.2.
Japanese Notice of Reasons for Rejection dated Mar. 3, 2022 for Japanese Application No. 2019-560276.
Chinese Office Action dated Sep. 8, 2022 for Chinese Application No. 201880029662.8.

\* cited by examiner

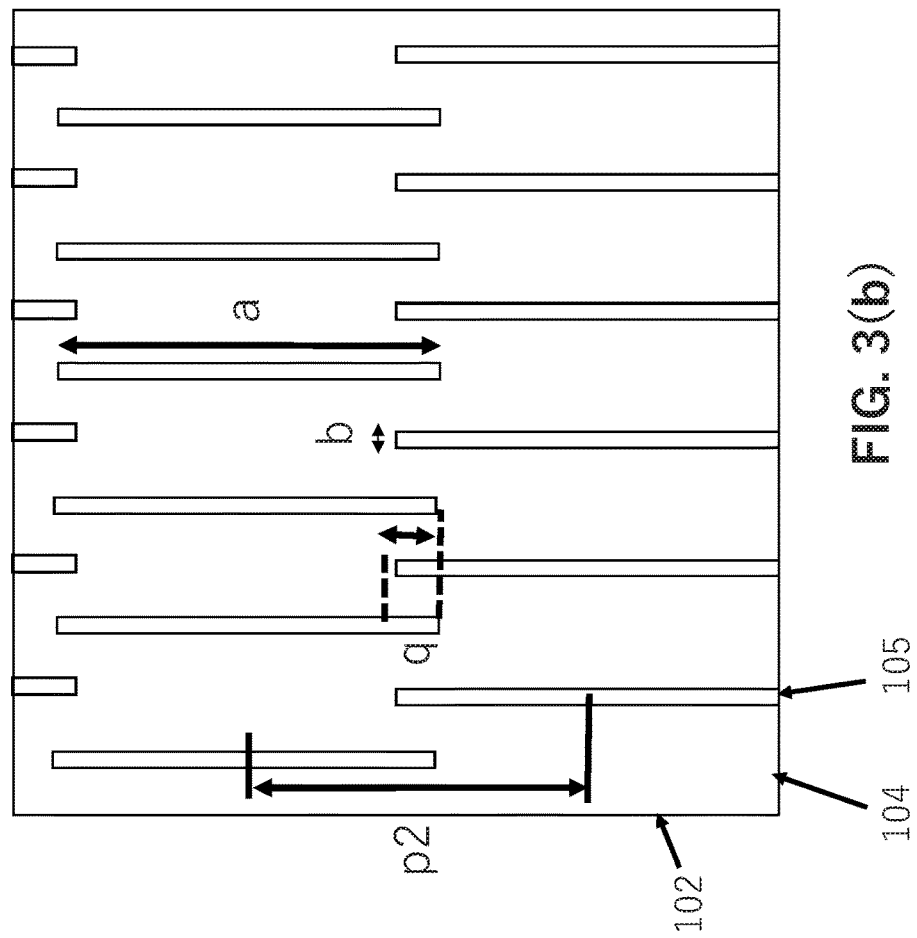
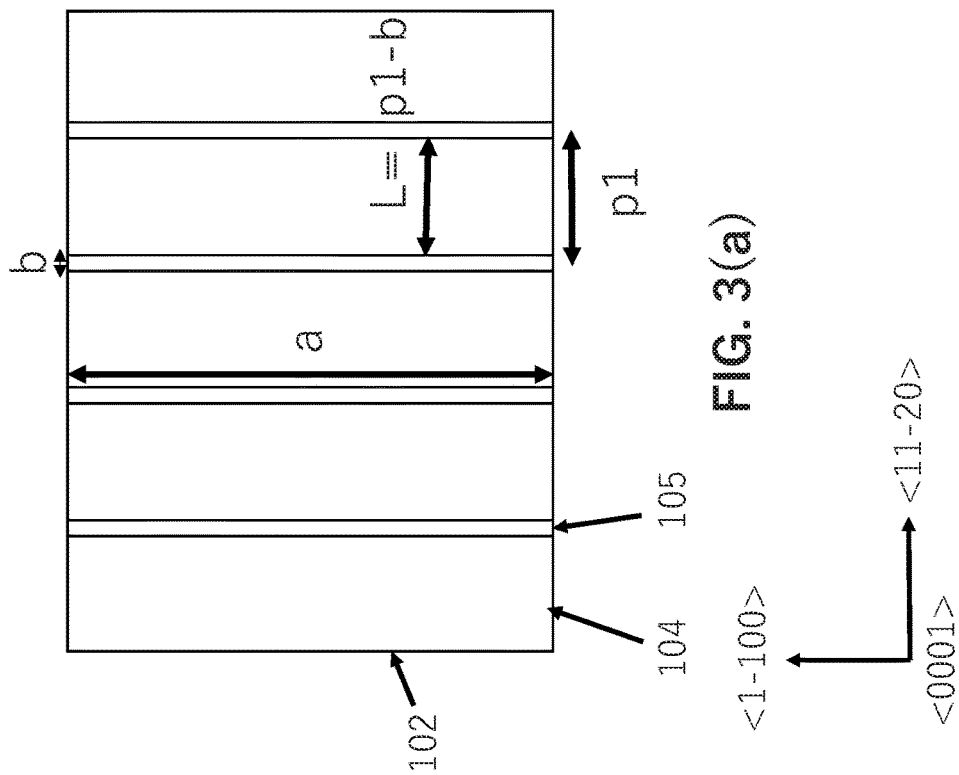

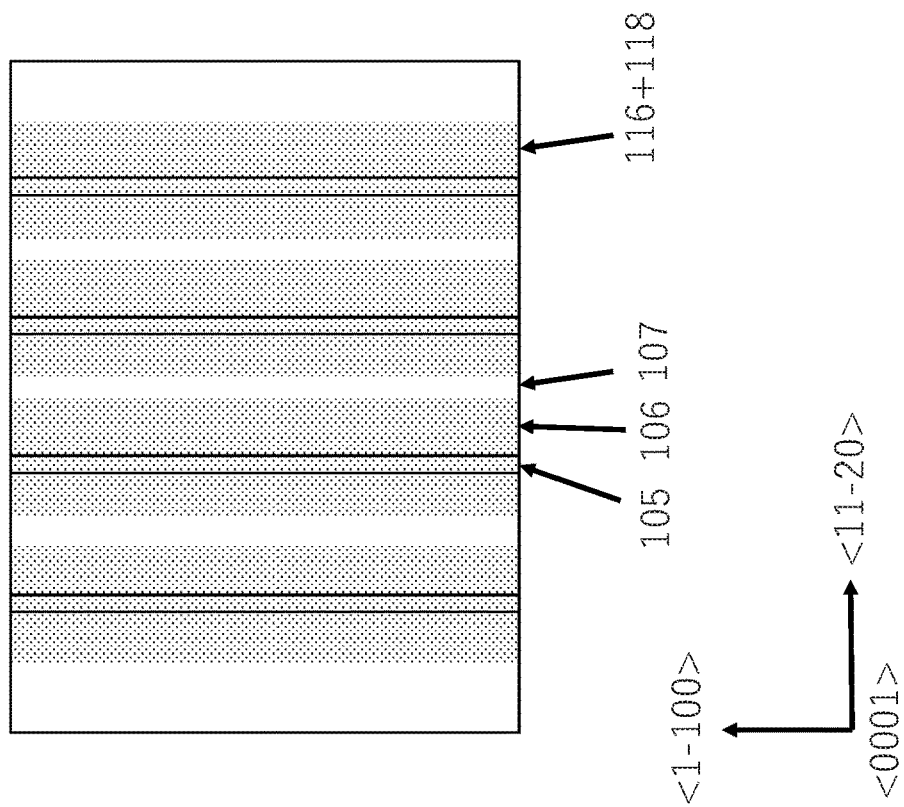
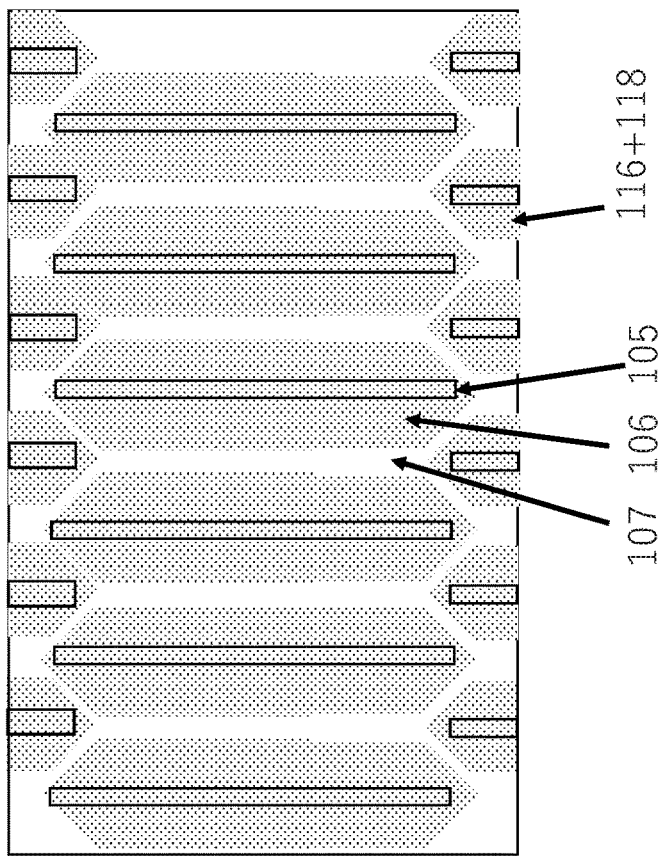
FIG. 4(a)
FIG. 4(b)

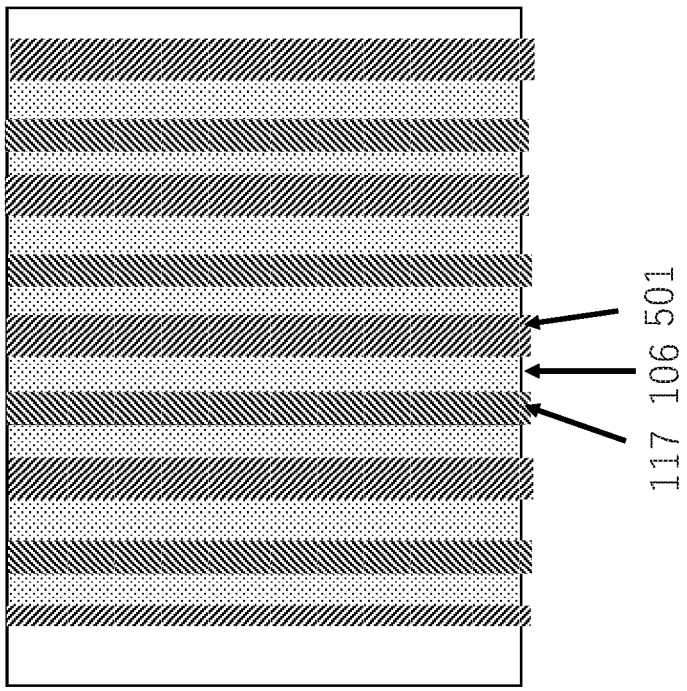
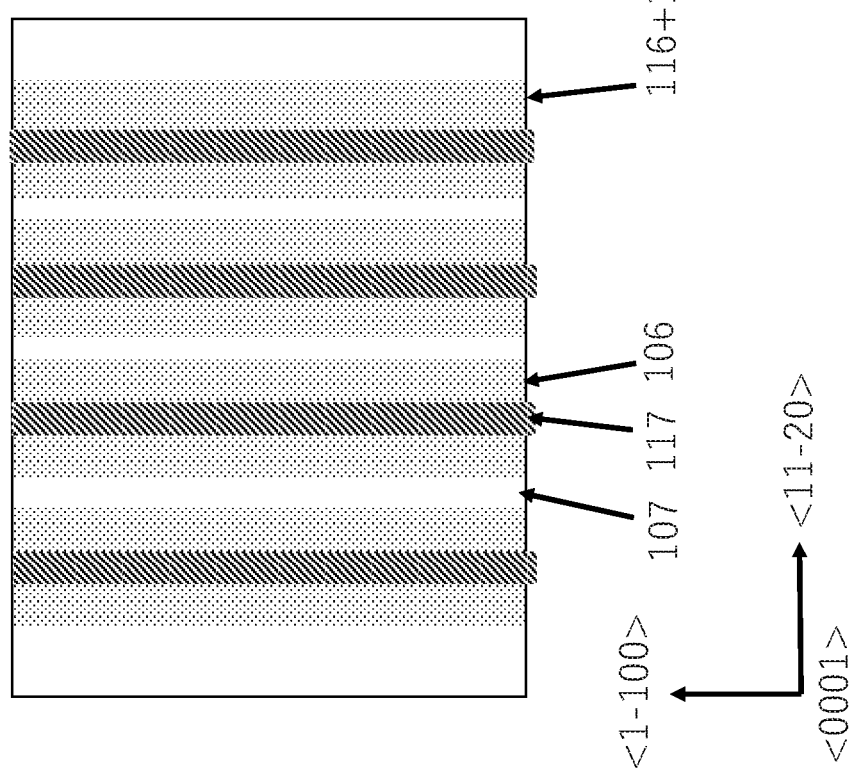
FIG. 5(a)
FIG. 5(b)

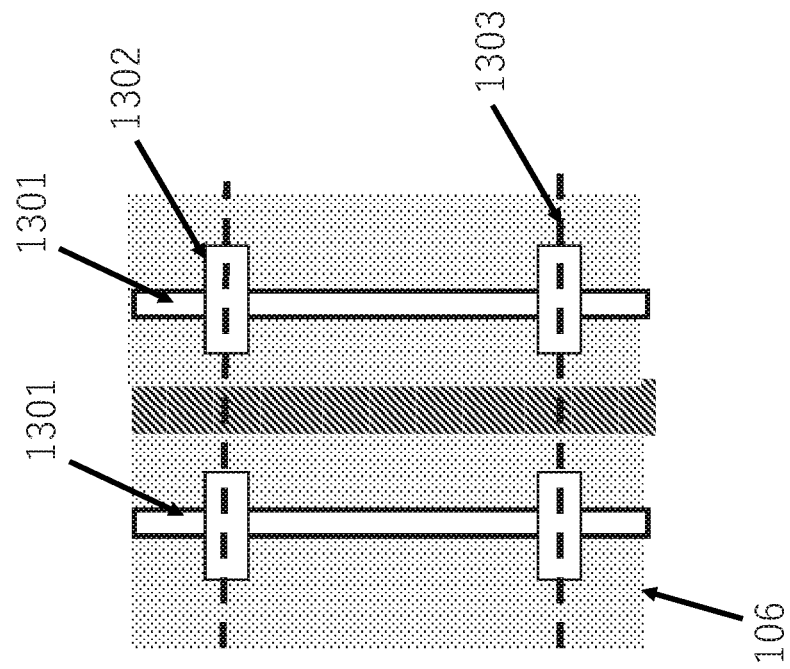
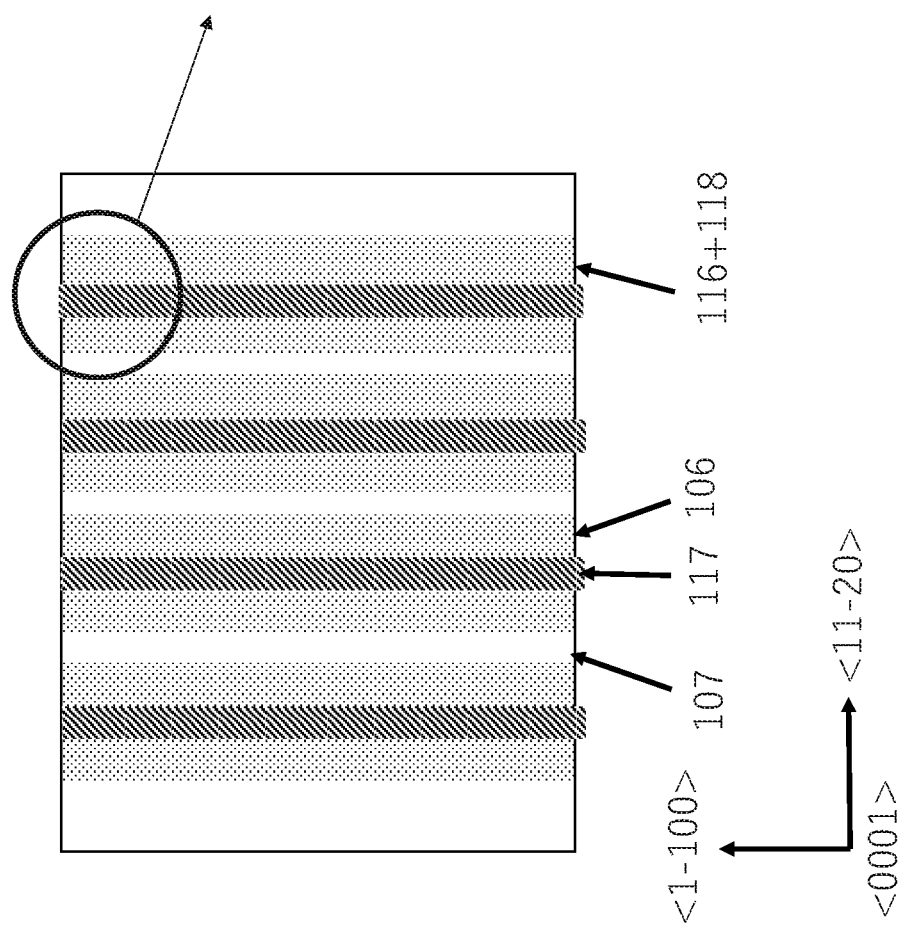
FIG. 13(a)
FIG. 13(b)

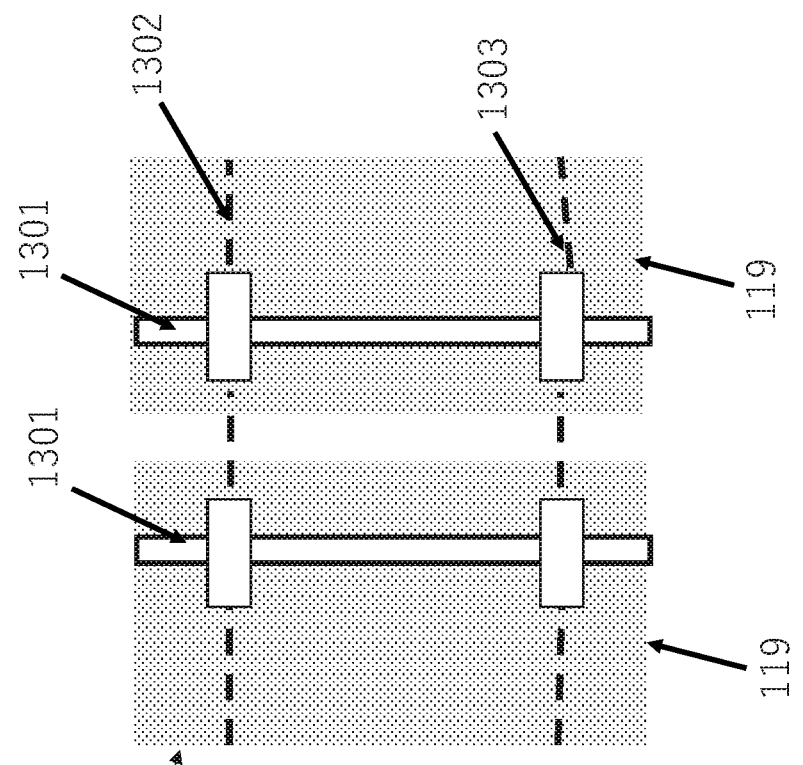
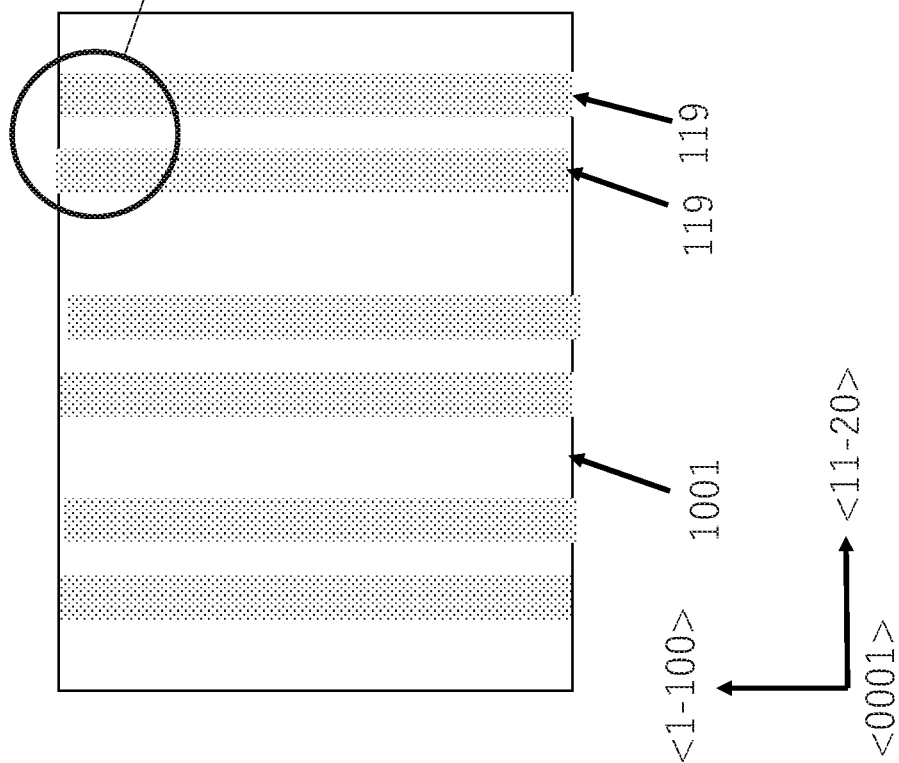
FIG. 14(a)
FIG. 14(b)

METHOD OF REMOVING A SUBSTRATE

CROSS REFERENCE TO RELATED APPLICATION

This application claims the benefit under 35 U.S.C. Section 119(e) of the following and commonly-assigned application:

U.S. Provisional Patent Application No. 62/502,205, filed on May 5, 2017, by Takeshi Kamikawa, Srinivas Gandrothula, Hongjian Li and Daniel A. Cohen, entitled "METHOD OF REMOVING A SUBSTRATE,"

which application is incorporated by reference herein.

BACKGROUND OF THE INVENTION

1. Field of the Invention

This invention relates to a method for removing a substrate, including removing GaN-based substrates from GaN-based semiconductor layers.

2. Description of the Related Art

The industrial value of a high-value semiconductor obtained equality upon a low-priced substrate made of different materials is extremely high. Therefore, research and development have sought to realize this goal for a long time.

This is especially true in a gallium arsenide (GaAs)-based semiconductor thin film growth upon a silicon (Si) substrate and gallium nitride (GaN)-based semiconductor thin film growth upon a sapphire ($Al_2O_3$) substrate. In both instances, a relatively good quality semiconductor thin film can be obtained using an epitaxial lateral overgrowth (ELO) technique.

However, using a substrate made of different materials involves a number of problems. For example, due to different thermal expansion constants, the substrate may bow or become curved during epitaxial growth under high temperature.

Moreover, the substrate may be subjected to non-uniform temperatures, which may cause non-uniformity of the doping concentration, the thickness of the layers, the content of indium (In). This situation may cause a decrease in yield.

With regard to GaN-based semiconductors, many researchers have tried to avoid these issues using GaN substrates. However, GaN substrates, which are typically produced using HVPE (hydride vapor phase epitaxy), are very expensive.

For example, 2-inch c-plane polar GaN substrates cost about $1000/wafer, while 2-inch semipolar GaN substrates cost about $10000/wafer. Thus, there is a desire to recycle GaN substrates.

It is easy to remove a GaN device from a substrate of different materials, such as a sapphire substrate. For example, there are many defects at the GaN/sapphire interface, which means that bonding strength at the interface is weak. See, e.g., US Patent Publication No. 2012/0280363 A1.

However, a mechanical removal method, such as ultrasonic removal, may damage the semiconductor layers. This is a problem especially for edge emitting laser diodes (EELDs), which need smooth facets. With a mechanical removal method, cracks may occur. For example, when cleaving the device, damage may cause cracks in unintended directions. It is necessary to reduce any such damage.

Furthermore, the GaN/sapphire interface absorbs laser light due to the many defects at the interface. Consequently, a laser ablation method may be used to remove the substrate from the semiconductor layers.

On the other hand, the use of a GaN substrate, in order to obtain high quality GaN-based semiconductor layers and avoid bowing or curvature of the substrate during epitaxial growth, makes it hard to remove the substrate, because there is no heterointerface, such as with GaN/sapphire.

One conventional technique is the use of photoelectrochemical (PEC) etching of sacrificial layers to remove device structures from GaN substrates, but this takes a long time and involves several complicated processes. Moreover, the yield from these processes have not reached industry expectations.

Thus, there is a need in the art for improved methods of removing substrates, especially where GaN thin films are grown on GaN substrates. The present invention satisfies this need.

SUMMARY OF THE INVENTION

To overcome the limitations in the prior art described above, and to overcome other limitations that will become apparent upon reading and understanding this specification, the present invention discloses a method for removing a substrate, and specifically, a method of removing GaN-based substrates from GaN-based semiconductor layers in an easy manner, so that the GaN-based substrates can be recycled.

BRIEF DESCRIPTION OF THE DRAWINGS

Referring now to the drawings in which like reference numbers represent corresponding parts throughout:

FIGS. 3(a) and 3(b) illustrate the growth restrict mask and the opening areas of the growth restrict mask.

FIGS. 4(a) and 4(b) illustrate the growth restrict mask, the opening areas of the growth restrict mask, the flat surface region and the layer bending region.

FIGS. 5(a) and 5(b) illustrate the etching at the layer bending region.

FIGS. 13(a) and 13(b) illustrate a method of making facets for a laser diode device, as well as chip scribing techniques.

FIGS. 14(a) and 14(b) also illustrate a method of making facets for a laser diode device, as well as chip scribing techniques.

DETAILED DESCRIPTION OF THE INVENTION

In the following description of the preferred embodiment, reference is made to a specific embodiment in which the invention may be practiced. It is to be understood that other embodiments may be utilized and structural changes may be made without departing from the scope of the present invention.

Overview

Generally, the present invention describes a method for manufacturing a GaN-based semiconductor device, so that a GaN-based substrate can be removed from the GaN-based semiconductor device, and the GaN-based substrate recycled. This is accomplished using at least the following steps:

1. Epitaxial Lateral Overgrowth (ELO), Growth of Device Layers, p-Electrode Deposition and Ridge Stripe Processing.

Figure 1:
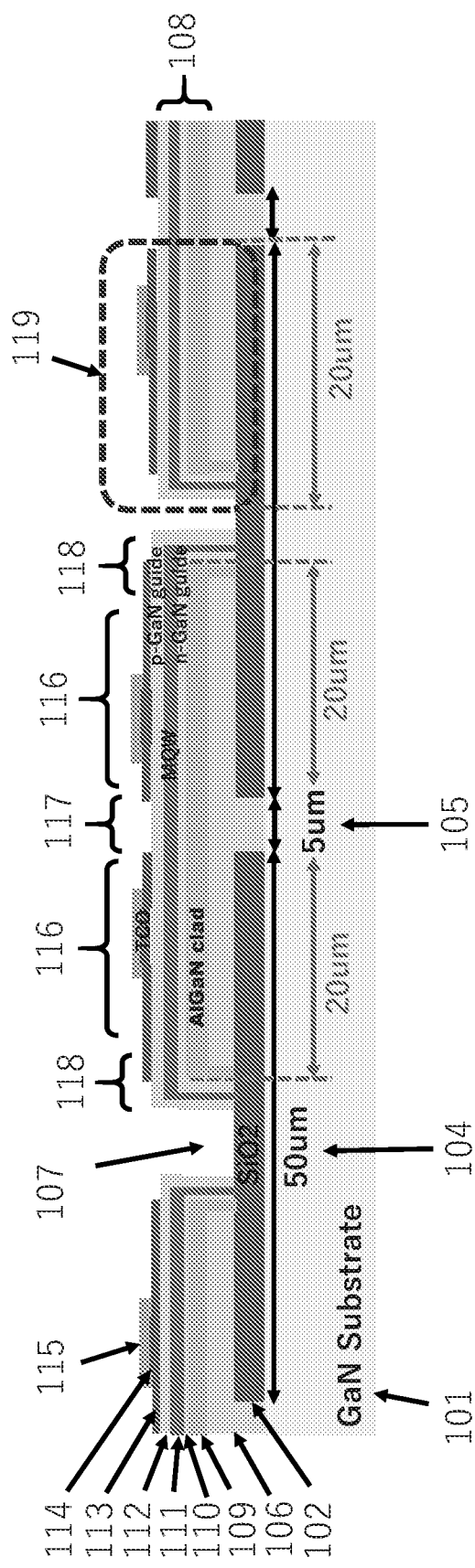
FIGS. 1 and 2 are schematics of device structures fabricated according to the present invention.

This step is described in FIG. 1, which illustrates a GaN-based substrate 101 with an $SiO_2$-based growth restrict mask 102 formed thereon. Alternatively, as shown in FIG. 2, a GaN-based intermediate layer 103 may be deposited first on the GaN-based substrate 101 with the $SiO_2$-based growth restrict mask 102 formed on the GaN-based intermediate layer 103.

The growth restrict mask 102 is patterned into stripes 104, and includes opening areas 105 between the stripes 104 for epitaxial lateral overgrowth of GaN-based layers 106. Each of the stripes 104 of the growth restrict mask 102 has a width of about 50 μm with each of the opening areas 105 having a width of about 5 μm separating adjacent ones of the stripes 104.

Figure 2:
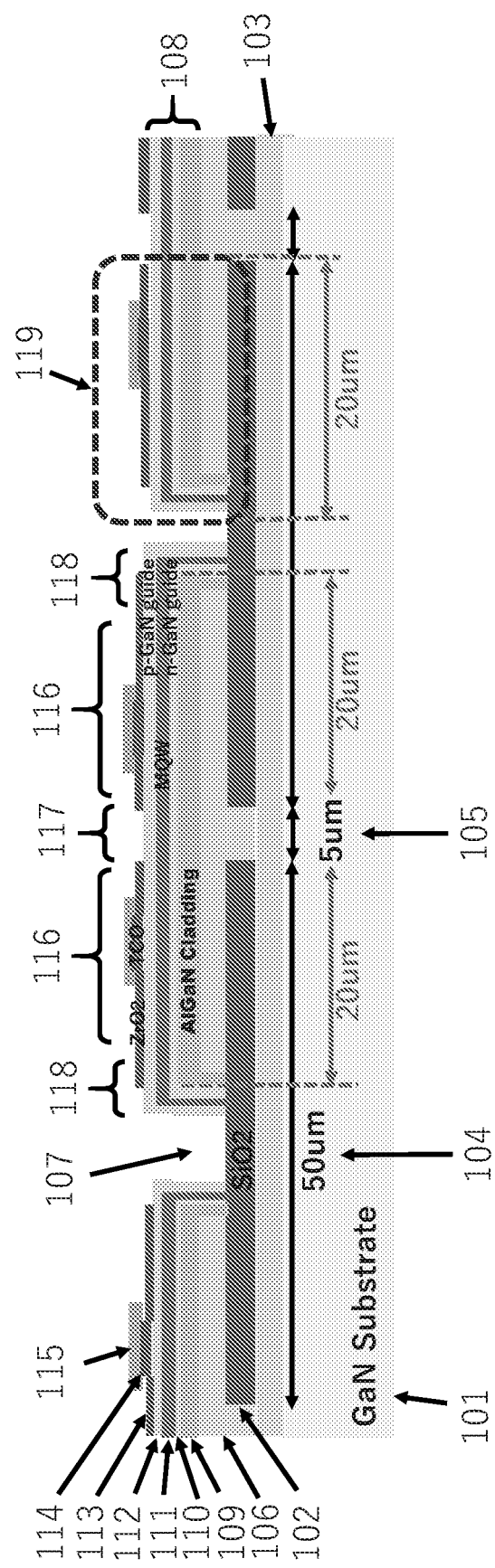

The growth of the ELO GaN-based layers 106 occurs first in the opening areas 105, on either the GaN-based substrate 101 as shown in FIG. 1 or the GaN-based intermediate layer 103 as shown in FIG. 2, and then laterally from the opening areas 105 over the stripes 104 of the growth restrict mask 102. The growth of the ELO GaN-based layers 106 is stopped or interrupted before the ELO GaN-based layers 106 at adjacent opening areas 105 can coalesce on top of the growth restrict mask 102. Preferably, the ELO GaN-based layers 106 have a lateral width of about 20 μm in a wing region of the stripe 104 of the growth restrict mask 102. This interrupted growth results in no-growth regions 107 between adjacent ELO GaN-based layers 106.

Thereafter, semiconductor device layers 108 are grown on or above the ELO GaN-based layers 106. In one embodiment, the semiconductor device layers 108 may include an AlGaN cladding layer 109, n-GaN guiding layer 110, InGaN/GaN multiple quantum well (MQW) active region 111, and p-GaN guiding layer 112. A Transparent Conductive Oxide (TCO) cladding layer 113 is deposited on the p-GaN guiding layer 112, followed by the deposition of a current limiting layer 114. Finally, a p-pad 115 is deposited on the TCO cladding layer 113.

The combined thickness of the ELO GaN-based layers 106 and the semiconductor device layers 108 may range from 1 to 20 μm, for example, but is not limited to these values. The combined thickness of the ELO GaN-based layers 106 and semiconductor device layers 108 is measured from the surface of growth restrict mask 102 to the upper surface of the semiconductor device layers 108.

The semiconductor device layers 108 include one or more flat surface regions 116 separated by etching regions 117, which are bounded on both sides by layer bending regions 118 at the edges thereof adjacent the no-growth regions 107. The width of the flat surface region 116 is preferably at least 5 μm, and more preferably is 10 μm or more. There is a high uniformity to the thickness of each of the semiconductor device layers 108 in the flat surface region 116.

The semiconductor device layers 108 separated by etching regions 117 and/or no-growth regions 107 are referred to as island-like semiconductor layers 119. Each of the island-like semiconductor layers 119 may be processed into a separate device. For example, ridge stripe processing may be carried out on each of the island-like semiconductor layers 119 to form separate laser devices.

These elements are further shown and described in more detail in conjunction with FIGS. 3(a)-3(b), 4(a)-4(b), 5(a)-5(b), 6(a)-6(c), 7 and 8 below.

2. Dry Etching Below the Surface of the GaN-Based Substrate.

Figure 9:
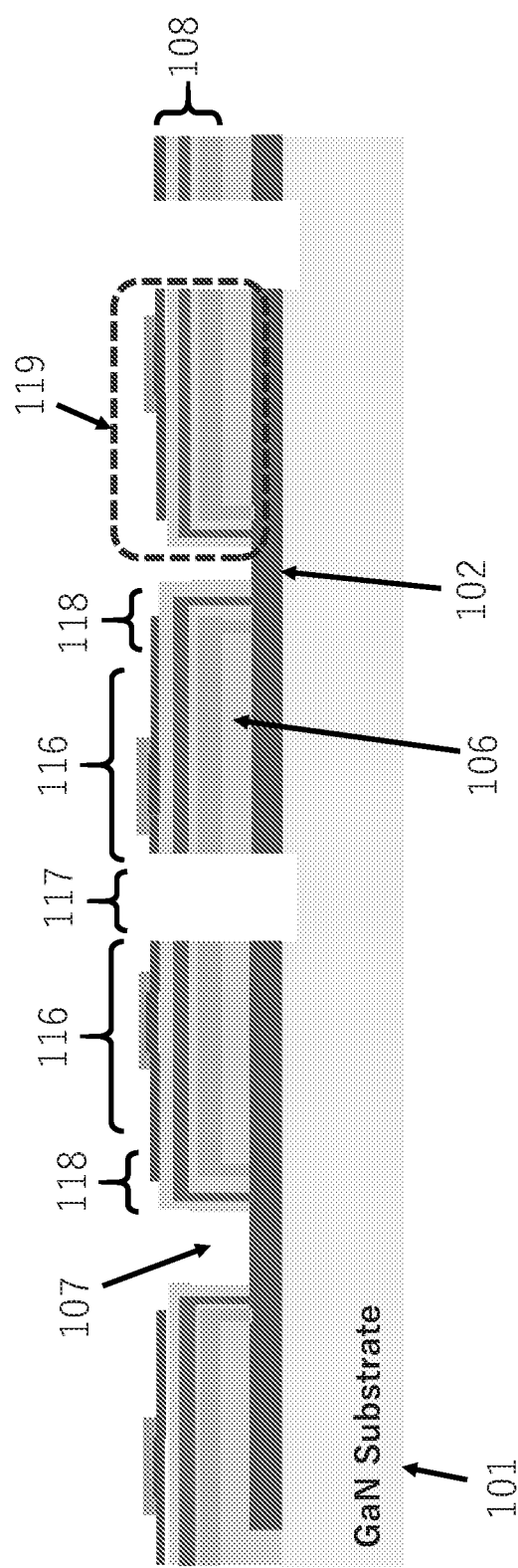
FIG. 9 is a schematic of a device structure where there has been dry etching below a surface of the GaN-based substrate.

This step is described in FIG. 9. Dry etching is performed on the etching region 117, through the device layers 108 and the ELO GaN-based layers 106, to expose the growth restrict mask 102. This etching results in the creation of the island-like semiconductor layers 119, including the flat region 116 and the layer bending region 118, and initiates the step to separate the island-like semiconductor layers 119 from the GaN-based substrate 101.

It is not always necessary to etch the surface of the GaN-based substrate 101, as long as the growth restrict mask 102 is exposed. More preferably, etching is performed up to the surface of the GaN-based substrate 101, so that the GaN-based substrate 101 can be easily removed.

3. Bonding a Support Substrate.

Figure 10:
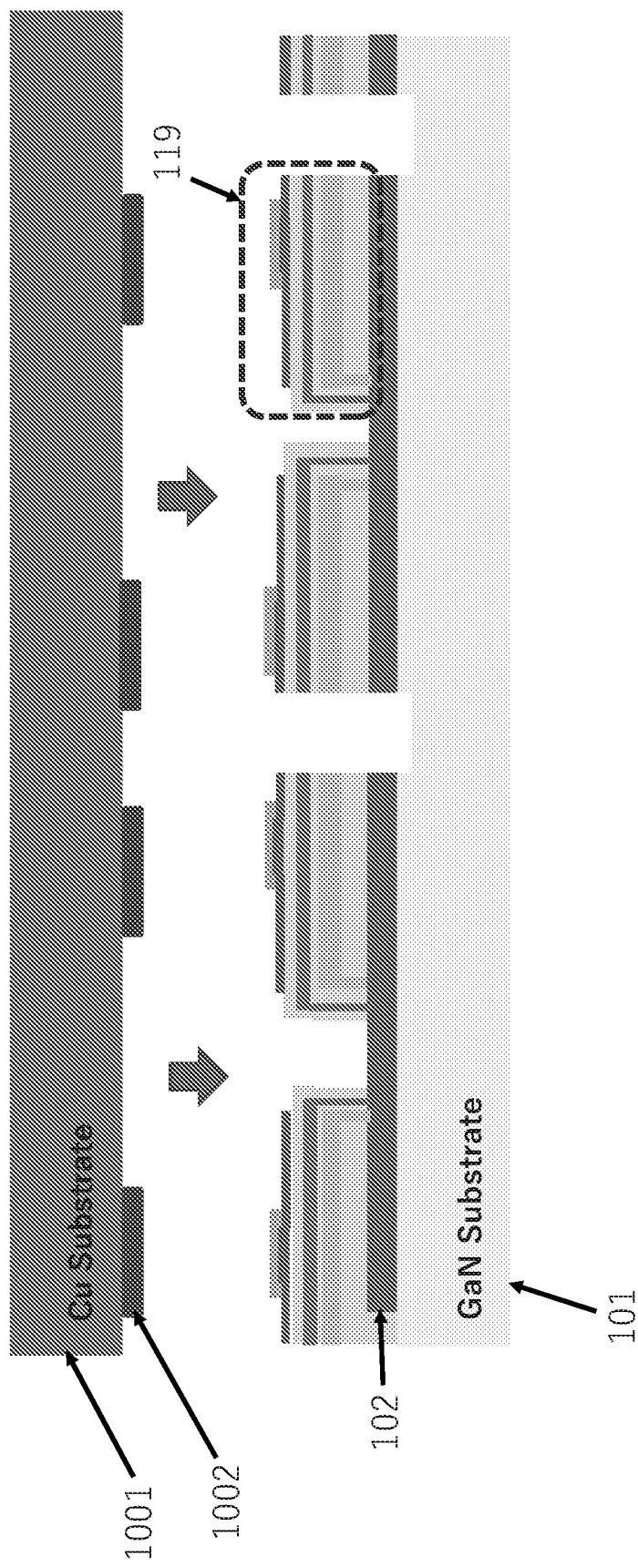
FIG. 10 is a schematic of bonding a support substrate.

This step is shown in FIG. 10. The island-like semiconductor layers 119 are flip-chip bonded to a support substrate 1001 with metal or solder bonding pads 1002 deposited thereon, using metal-metal bonding or soldering techniques.

4. Dissolving the Growth Restrict Mask by Wet Etching.

Figure 11:
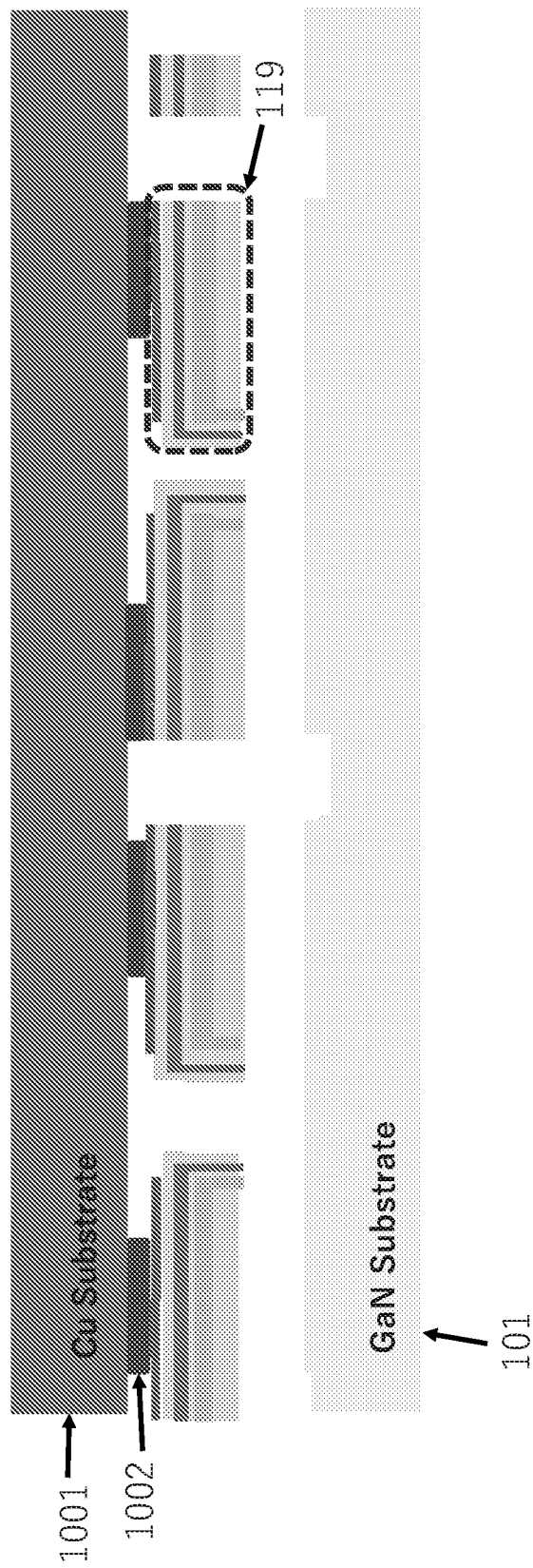
FIG. 11 is a schematic of dissolving a growth restrict mask by wet etching.

This step is shown in FIG. 11. The $SiO_2$ of the growth restrict mask 102 (shown in FIG. 10) is removed using a chemical solution, such as hydrofluoric (HF) or buffered hydrofluoric (BHF) acid, which lifts off the GaN-based substrate 101 from the island-like semiconductor layers 119.

5. N-Electrode Deposition.

Figure 12:
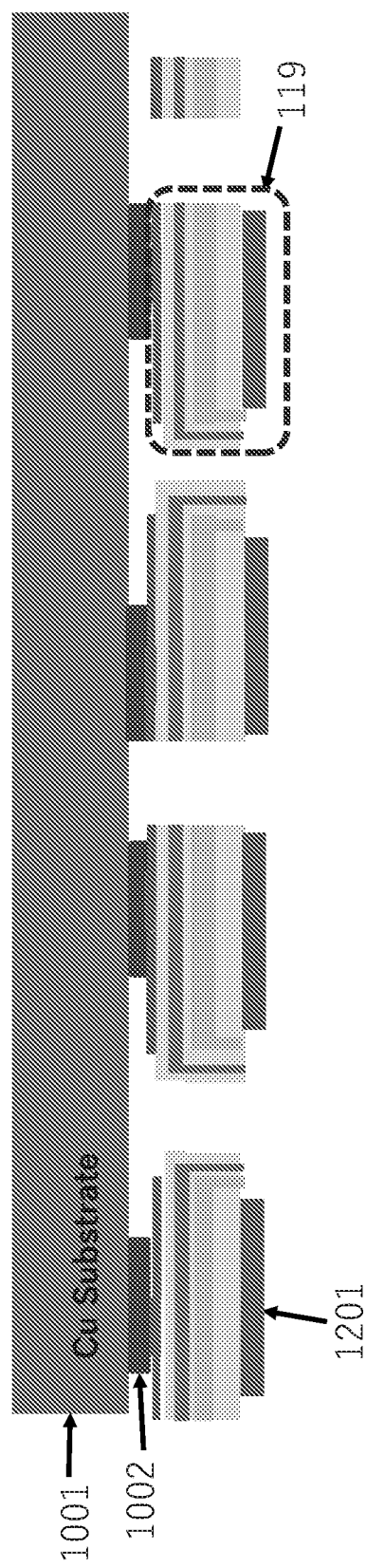
FIG. 12 is a schematic of n-electrode deposition.

This step is shown in FIG. 12. N-electrodes 1201 are deposited on the back side of the island-like semiconductor layers 119 following lift-off of the GaN-based substrate 101.

6. Chip Scribing.

This step is shown in FIGS. 13(a)-13(b) and 14(a)-14(b). Chip scribing is performed using solid or dashed lines.

These and other aspects of the present invention are described in more detail below.

Definitions of Terms

GaN-Based Substrate

Any GaN-based substrate 101 that is sliced on a {0001}, {1-100}, {11-20}, {20-21}, {20-2-1}, {11-22} plane, or other plane, from a bulk GaN crystal can be used. The GaN-based substrate 101 may include Al, In, B, etc.

GaN-Based Semiconductor Layers

The GaN-based semiconductor layers include the ELO GaN-based layers 106, device layers 108 such as AlGaN cladding layer 109, n-GaN guiding layer 110, InGaN/GaN multiple quantum well (MQW) active region 111 and p-GaN guiding layer 112, as well as intermediate layers 103.

These GaN-based semiconductor layers can include In, Al and/or B, as well as other dopants and impurities, such as Mg, Si, Zn, O, C, H, etc. The GaN-based semiconductor layers specifically may comprise GaN layers, AlGaN layers, AlGaInN layers, InGaN layers, etc.

As noted above, the device layers 108 such as AlGaN cladding layer 109, n-GaN guiding layer 110, InGaN/GaN multiple quantum well (MQW) active region 111 and p-GaN guiding layer 112, typically include at least one layer among an n-type layer, an undoped layer and a p-type layer.

Using the GaN-based semiconductor layers, the resulting device may comprise, for example, a light-emitting diode (LED), laser diode (LD), Schottky barrier diode (SBD), photodiode, metal-oxide-semiconductor field-effect-transistor (MOSFET), etc., but is not limited to these devices. This invention is particularly useful for micro-LEDs and laser diodes, such as edge-emitting lasers and vertical cavity surface-emitting lasers (VCSELs).

Growth Restrict Mask

The growth restrict mask 102 comprises a dielectric layer, such as $SiO_2$, SiN, SiON, $Al_2O_3$, AlN, AlON, or a refractory metal, such as W, Mo, Ta, Nb, etc. The growth restrict mask 102 may be a laminate or stacking layer structure selected from the above materials.

In one embodiment, the thickness of the growth restrict mask 102 is about 0.05-3 µm. The width of each of the stripes 104 of the growth restrict mask 102 is preferably larger than 20 µm, more preferably larger than 40 µm, and most preferably about 50 µm.

As noted above, the growth restrict mask 102 is patterned into stripes 104 and includes opening areas 105 between the stripes 104. In one embodiment shown in FIG. 3(a), the opening areas 105 are striped having a length a and a width b. The length a of each of the opening areas 105 is in a first direction parallel to the 1-100 direction of the (0001) c-plane-oriented GaN-based substrate 101 and the width b of each of the opening areas 105 is in a second direction parallel to the 11-20 direction of the (0001) c-plane-oriented GaN-based substrate 101, periodically at a first interval p1, extending in the second direction. The width b of each of the opening areas 105 is typically constant, but may be changed as necessary. The width L of each of the stripes 104 of the growth restrict mask 102 is L=p1−b.

In another embodiment shown in FIG. 3(b), the length and width of each of the opening areas 105 are arranged in similar directions as FIG. 3(a), but the lengths a may be different and adjacent opening areas 105 are offset in the first direction by a second interval p2 and are shifted in the second direction by a half of the first interval p1, in a manner such that end portions of adjacent opening areas 105 overlap lengthwise for a predetermined distance q in the first direction. This arrangement prevents embossment of both end portions of the opening areas 105 in the 1-100 direction of the GaN-based substrate 101.

In both of these embodiments, the interval p1 may be about 5 to 120 µm; the interval p2 may be about 500 to 1050 µm; the length a may be about 200 to 2000 µm; the width b may be about 2 to 20 µm; and the distance q may be about 35 to 40 µm. In FIG. 3(a), for example, the interval p1 may be about 55 µm; the interval p2 may be about 810 µm; the length a may be about 1200 µm; the width b may be about 5 µm; and the width L is 50 µm.

ELO GaN-Based Layers

FIGS. 4(a) and 4(b) illustrate the ELO GaN-based layers 106 grown using the growth restrict masks 102 of FIGS. 3(a) and 3(b), respectively.

Using the growth restrict mask 102, the ELO GaN-based layers 106 are grown in an island-like shape in the (0001) plane orientation by a vapor-phase deposition method, for example, a metalorganic chemical vapor deposition (MOCVD) method.

The surface of the GaN-based substrate 101 or the GaN-based intermediate layer 103 is exposed in the opening areas 105 of the growth restrict mask 102, and the ELO GaN-based layers 106 are selectively grown thereon, continuously in both vertical and lateral directions relative to the growth restrict mask 102. The growth is stopped before the ELO GaN-based layers 106 coalesce with adjacent ELO GaN-based layers 106 on the growth restrict mask 102.

For (0001) plane growth of a GaN-based semiconductor, the lateral growth rate parallel to the plane is the largest in the 11-20 direction and is the smallest in the 1-100 direction. In the growth restrict mask 102 shown in FIGS. 3(a) and 3(b), as the longitudinal direction of the opening area 105 is the 1-100 direction, the growth rate of the GaN-based semiconductor is small at both ends of the opening area 105, the ELO GaN-based layers 106 opposing each other in the 1-100 direction do not coalesce and remain separated from each other. The length of the ELO GaN-based layers 106 in the 1-100 direction becomes nearly equal with the length a of the opening area 105.

The thickness of the ELO GaN-based layers 106 is important, because it determines the width of the flat surface region 116. Preferably, the width of the flat surface region 116 is 20 µm or more. The thickness of the ELO GaN-based layers 106 is preferably as thin as possible, to reduce processing time and to facilitate etching the opening areas 105.

The growth ratio of the ELO GaN-based layers 106 is the ratio of the growth rate of the lateral direction parallel to the 11-20 axis of the GaN-based substrate 101 to the growth rate of the vertical direction parallel to the 0001 axis of the GaN-based substrate 101. Preferably, the growth ratio of the ELO GaN-based layers 106 is high, wherein, by optimizing the growth conditions, the growth ratio of the ELO GaN-based layers 106 can be controlled from 1 to 4.

In the case where the ratio of the ELO GaN-based layers 106 is 4, the ELO GaN-based layers 106 are only about 5 µm in thickness, but obtain a width of the flat surface region 116 of 20 µm. In this case, it is very easy to etch the opening areas 105.

In order to obtain a high ratio for the ELO GaN-based layers 106, the growth temperature of the ELO GaN-based layers 106 is preferably higher than about 950° C. and the pressure in the MOCVD chamber is preferably lower than about 100 Torr. Also, in order to promote the migration of Ga atoms, the V/III ratio is preferably high.

When the distance between the ELO GaN-based layers 106 on opposing planes with lowest growth rates is large, the following disadvantages occur. In the mask portion of the growth restrict mask 102 at the regions between the ELO GaN-based layers 106 in the 1-100 direction of which the growth rate is the lowest, raw gas is not consumed, and therefore, the gas concentration increases, and a concentration gradient in the 1-100 direction is generated, and by diffusion according to the concentration gradient, a large amount of the gas is supplied at the edge portions in the 1-100 direction of the ELO GaN-based layers 106. As the result, the thickness of the edge portions in the 1-100 direction of the ELO GaN-based layers 106 increases in comparison with other portions, and results in a raised shape. The raised shape causes not only structural inconveniences in the devices, but also creates problems in the following manufacturing processes of photolithography, etc.

To prevent the raised shape, the ELO GaN-based layers 106 come as close as possible, and thus it is necessary not to create in-plane uniformity of the raw gas from the beginning of the growth. In the growth restrict mask 102 shown in FIG. 3(b), the opening areas 105 adjacent to each other in the 11-20 direction are formed in a manner such that the opening areas 105 overlap at opposing end portions for the length q.

As a result, the in-plane uniformity of gas concentration is obtained by consumption of the raw gas caused by growing the ELO GaN-based layers 106. Finally, this results in a uniformity in the thickness of the island-like semiconductor layers 119.

Etching of Opening Areas

FIGS. 5 and 6 illustrate the details of the etching process of the opening areas 105.

FIG. 5(a) shows the no-growth regions 107, the ELO GaN-based layers 106, the flat surface regions 116, the layer bending regions 118, and the etching regions 117, based on the growth restrict mask 102 of FIG. 3(a), and FIG. 5(b) shows the ELO GaN-based layers 106 and the etching regions 117, where etching 501 has been performed to remove the layer bending regions 118 (not shown).

Figure 6B:
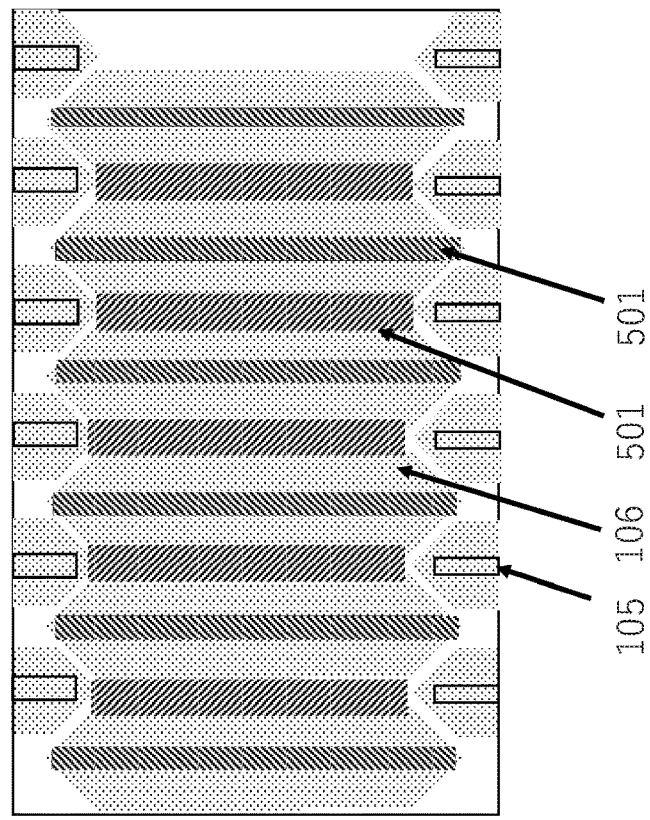
FIGS. 6(a), 6(b) and 6(c) illustrate the etching at the layer bending region, as well as the overwrap regions.
Figure 6A:
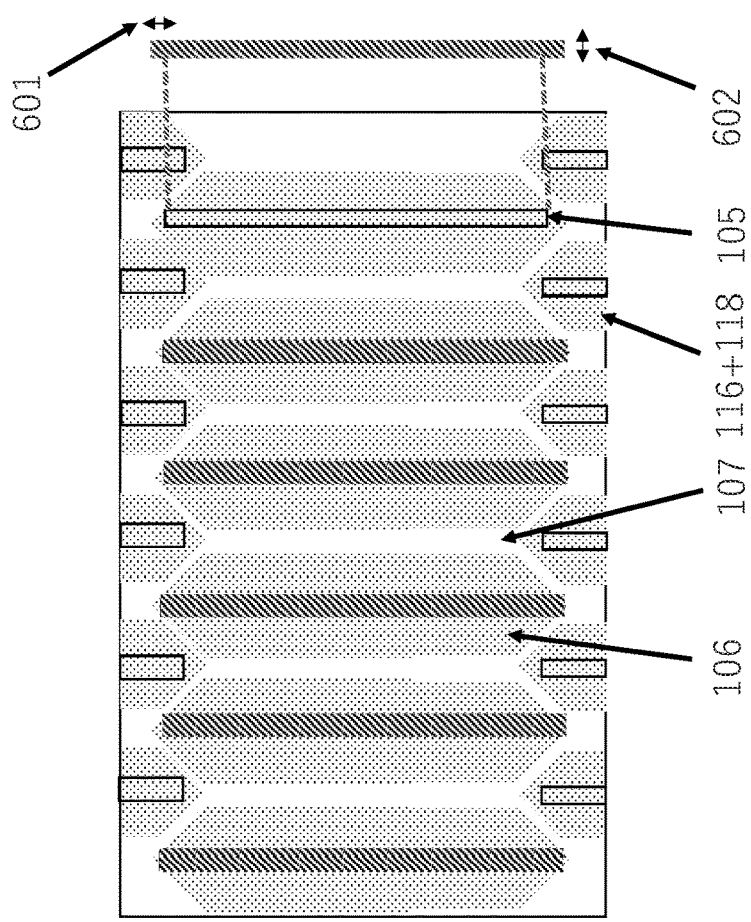

FIG. 6(a) shows the opening areas 105, the no-growth regions 107, the ELO GaN-based layers 106, the flat surface regions 116, and the layer bending regions 118, based on the growth restrict mask 102 of FIG. 3(b), and FIG. 6(b) shows the opening areas 105 and the ELO GaN-based layers 106, where etching 501 has been performed to remove the layer bending regions 118 (not shown).

As shown by 601 and 602 in FIG. 6(a), the etching 501 may be larger than the opening areas 105. In this example, the island-like semiconductor layers 119 do not have an interface with the GaN-based substrate 101 and other island-like semiconductor layers 119. With the wider etching area, the island-like semiconductor layers 119 can be removed quickly and easily from the GaN-based substrate 101.

Figure 6C:
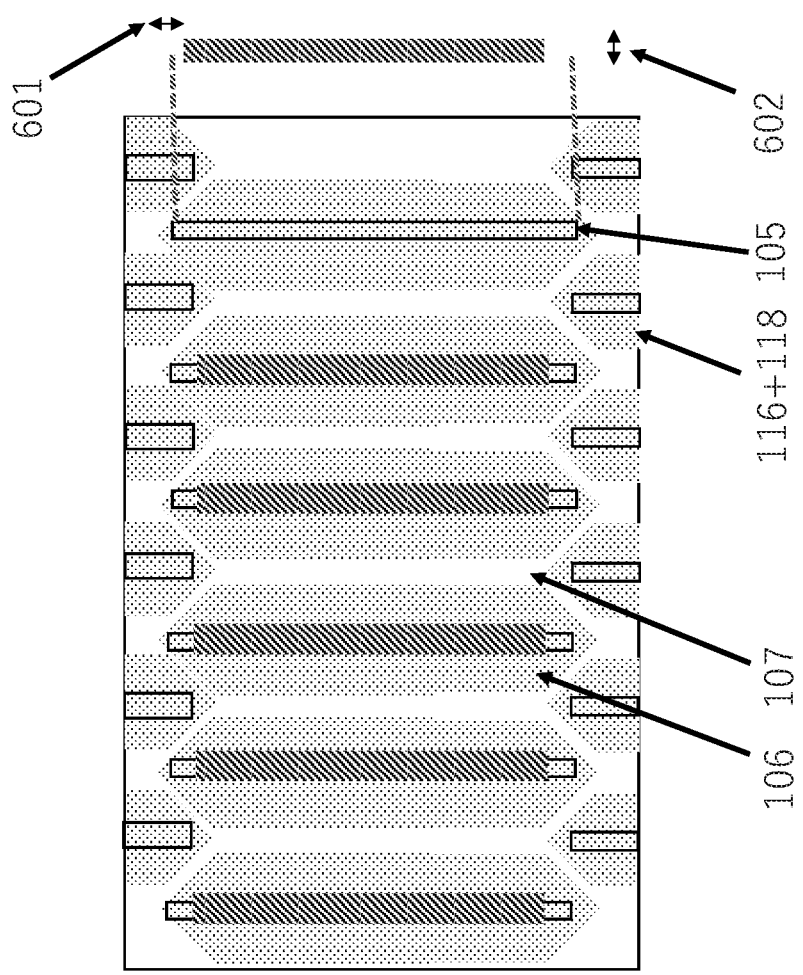

If the interface between the island-like semiconductor layers 119 and the GaN-based substrate 101 remains at least in part, it does provide some benefits. For example, FIG. 6(c) shows the case where the interface between the island-like semiconductor layers 119 and the GaN-based substrate 101 remains at both edges of the opening areas 105. In this case, it is easy to hold the island-like semiconductor layers 119 after the dry etching. However, it is best if the remaining area is as small as possible. After dry etching, the island-like semiconductor layers 119, which are on the growth restrict mask 102, can slide and be easily removed.

Etching Region

FIGS. 5 and 6 also illustrate the details of the etching regions 117.

The etching regions 117 are the location that is etched by a dry etch and/or wet etch to expose the growth restrict mask 102. As shown in FIGS. 5(a) and 5(b), the etching regions 117 are mainly on the opening areas 105. However, in FIGS. 6(a) and 6(c), there is an etching region 601 that overwraps a first direction and/or an etching region 602 that overwraps a second direction to the growth restrict mask 102 (not shown). This is to expose the growth restrict mask 102.

The overwrap width typically ranges between about 0 and 10 μm, and more preferably ranges between about 1 and 6 μm in the first direction, because the process yield is kept high. The second direction is almost the same value. However, the overwrap width may be different without causing any problems.

The etching regions 117 may be wider than the opening areas 105, so that that there is nothing else present at the interface between the island-like semiconductor layers 119 and the GaN-based substrate 101. This makes the GaN-based substrate 101 easy to remove from the island-like semiconductor layers 119.

Layer Bending Region

Figure 7:
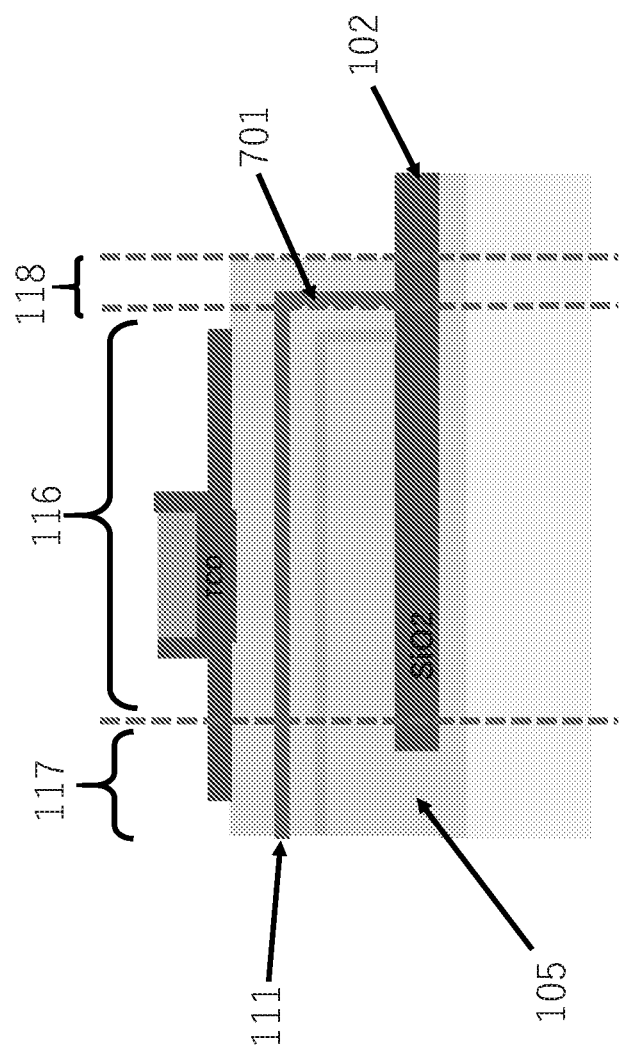
FIG. 7 is a schematic of a device structure including a bended active region.

FIG. 7 illustrates the details of the layer bending region 118, in conjunction with the growth restrict mask 102, the opening area 105, the flat surface region 116, and the etching region 117.

In one embodiment, the layer bending layer 118 may or may not be removed by etching. For example, simultaneous etching of both the etching region 117 and the layer bending region 118 may be performed in order to reduce the processing time and cost.

As shown in FIG. 7, the layer bending region 118 may include a bended active region 701. If the layer bending layer 118 is not removed by etching, and the bended active region 701 remains in the device, a portion of the light emitted from the active region 111 is reabsorbed. As a result, it may be preferable to remove the layer bending region 118.

Moreover, if the device is a laser diode, and the layer bending layer 118 is not removed by etching, so that the bended active region 701 remains in the device, the laser mode may be affected by the layer bending region 118 and the bended active region 701 due to a low refractive index (e.g., an InGaN layer) in the bended active region 701. As a result, it may be preferable to remove the layer bending region 118 and the bended active region 701.

Island-Like Semiconductor Layers

Figure 8:
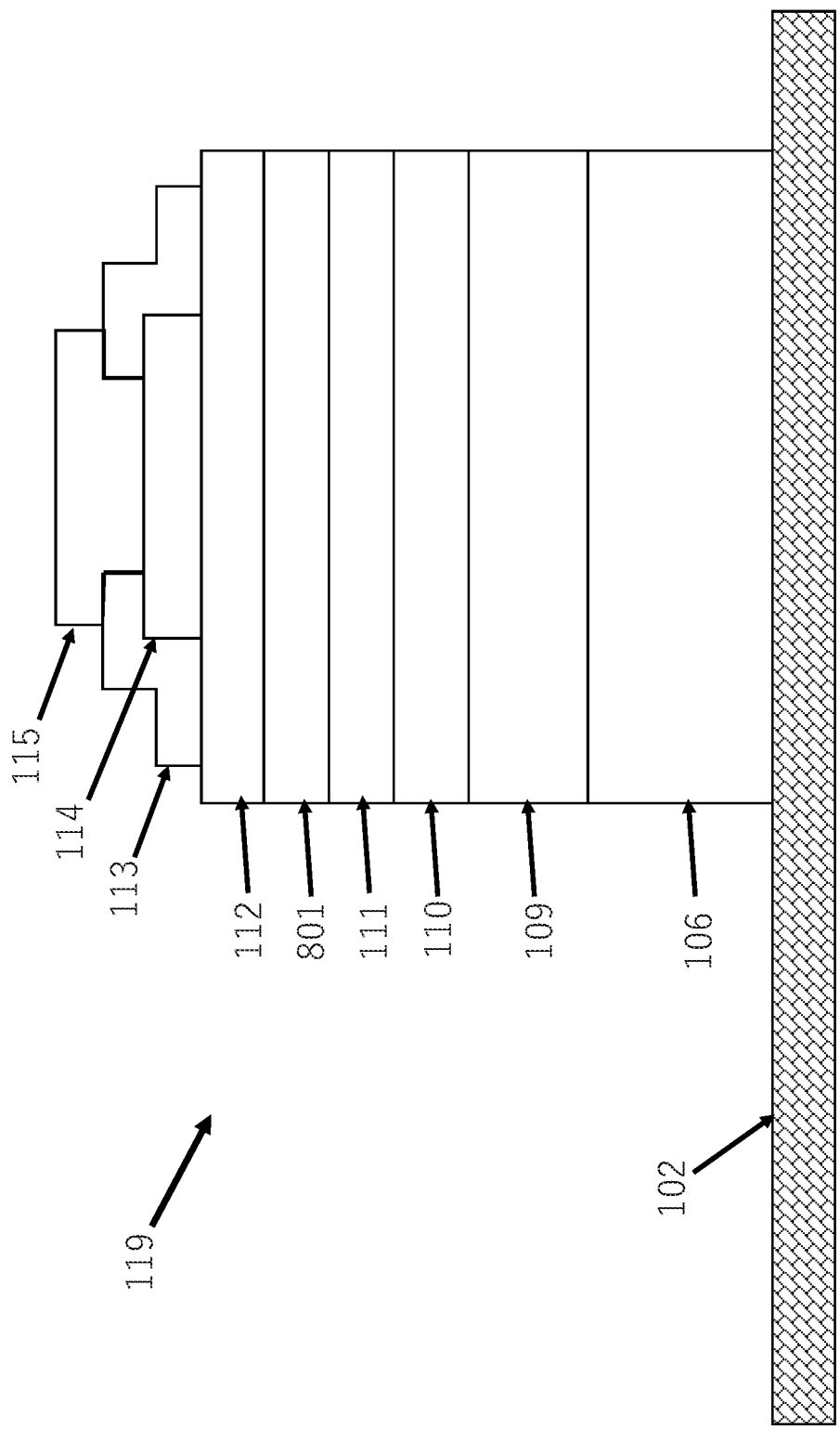
FIG. 8 is a schematic of a device structure formed by the island-like semiconductor layers.

FIG. 8 is a sectional view of the island-like semiconductor layers 119, which in this example comprise a laser diode.

Specifically, the III-nitride semiconductor laser diode is comprised of the following layers, laid one on top of another in the order mentioned, a 1.3 μm n-$Al_{0.06}$GaN cladding layer 109, a 0.4 μm n-GaN guiding layer 110, an InGaN/GaN MQW active region 111, a p-GaN guiding layer 112, an TCO cladding layer 113, a current limiting layer 114, and a p-electrode 115. Note that, in this example, there is an optional AlGaN electron blocking layer (EBL) 801 positioned between the InGaN/GaN MQW active region 111 and the p-GaN guiding layer 112.

The sectional view of FIG. 8 shows the laser bar along a direction perpendicular to an optical resonator, which is comprised of a ridge stripe structure. The ridge stripe structure is comprised of the TCO cladding layer 113, current limiting layer 114, and p-electrode 115, and provides optical confinement in a horizontal direction. The width of the ridge stripe structure is of the order of 1.0 to 20 μm, and typically is 5 μm.

In one embodiment, the p-electrode 115 may be comprised of one or more of the following materials: Pd, Ni, Ti, Pt, Mo, W, Ag, Au, etc. For example, the p-electrode may comprise Pd—Ag—Ni—Au (with thicknesses of 3-50-30-300 nm). These materials may be deposited by electron beam evaporation, sputter, thermal heat evaporation, etc. In addition, the p-electrode is typically deposited on the TCO cladding layer 113.

Etching Region

FIG. 9 shows the depth of etching region 117, which is at least below the surface of growth restrict mask 102 and, in this example, extends into the GaN-based substrate 101. In this case, it is easily to remove the growth restrict mask 102 using a wet etching method.

Support Substrate

FIG. 10 illustrates a support substrate 1001, which is bonded to the island-like semiconductor layers 119 individually using patterned bonding pads 1002. Conventional bonding techniques can be used.

The support substrate 1001 may be comprised of elemental semiconductor, compound semiconductor, metal, alloy, nitride-based ceramics, oxide-based ceramics, diamond, carbon, plastic, etc., and may comprise a single layer structure, or a multilayer structure made of these materials. A metal, such as solder, etc., or an organic adhesive, may be used for the patterned bonding pads 1002, and is selected as required.

In general, the most common types of flip-chip bonding are thermal compression bonding and wafer fusion/bonding. Wafer fusion has been popularly employed in InP-based devices. However, thermal compression bonding is generally much simpler than wafer fusion, as it uses metal-to-metal bonding, and has the benefit of also greatly improving thermal conductivity.

An Au—Au compression bond is by far the simplest bond and results in a fairly strong bond. An Au—Sn eutectic bond offers a much greater bond strength.

In one embodiment, a Cu substrate 1001 is used as the support substrate. The patterned Ti/Au bonding pads 1002 are fabricated on the Cu substrate 1001 by electron beam evaporation or sputter. The bonding pads 1002 are comprised of, in one example, Ti (10 nm) and Au (500 nm).

An activation of the exposed surface of the island-like semiconductor layers 119 may be performed before compression bonding. The activation is achieved using a plasma process of Ar and/or $O_2$.

Thereafter, the island-like semiconductor layers 119 are bonded to the bonding pads 1002 of the support substrate 1001 at about 150-300° C. under pressure.

Removing the Substrate

There are two techniques that can be used to remove the GaN-based substrate 101 from the island-like semiconductor layers 119.

One technique is to use just the support substrate 1001. The interface between the growth restrict mask 102 and the ELO GaN-based layers 106 has a weak bonding strength. Thus, it is easy to peel the island-like semiconductor layers 119 from the GaN-based substrate 101 using the support substrate 1001.

Another technique is to etch the growth restrict mask 102 using a hydrofluoric acid (HF), buffered HF (BHF), or other etchant, before removing the GaN-based substrate 101, to at least partially dissolve the growth restrict mask 102. This technique requires that the opening areas 105 and/or the etching regions 117 be etched until the growth restrict mask 102 is exposed. Once the growth restrict mask 102 is exposed, wet etching can partially or wholly dissolve the growth restrict mask 102, and then the GaN-based substrate 101 can be removed from the island-like semiconductor layers 119. This is illustrated in FIG. 11.

Specifically, after the support substrate 1001 has been bonded to the island-like semiconductor layers 119, the entire structure is dipped into a solvent for wet etching to dissolve the growth restrict mask 102. In one embodiment, the growth restrict mask 102, shown in FIG. 10, is $SiO_2$, which is dissolved by an HF or BHF solvent. The merit of this technique is that a wide area of $SiO_2$ is dissolved by the HF very easily and quickly, and there is no mechanical damage when the GaN-based substrate 101 is removed (very gently) from the island-like semiconductor layers 119.

The removed GaN-based substrate 101 shown in FIG. 11 then can be recycled. For example, the surface of the GaN-based substrate 101 may be re-polished by a polisher. The recycling process can be done repeatedly, which lowers the cost of fabricating GaN-based semiconductor devices.

First and Second Support Substrates

In another example, first and second support substrates may be used in the removal of the GaN-based substrate 101 from the island-like semiconductor layers 119. This method comprises the steps of bonding a first support substrate 1001 to the exposed surface of the island-like semiconductor layers 119, and bonding a second support substrate (not shown) to an exposed surface of the GaN-based substrate 101, before or after removing the GaN-based substrate 101 from the island-like semiconductor layers 119. Typically, the second support substrate bonded to the GaN-based substrate 101 later can be removed by dissolving low-temperature melted metal and/or solder bonding layers between the second support substrate bonded and the GaN-based substrate 101 using an appropriate etchant.

N-Electrodes

FIG. 12 illustrates the deposition of n-electrodes 1201 on the back side of the island-like semiconductor layers 119, which is exposed following the removal of the GaN-based substrate 101.

Typically, the n-electrodes 1201 may be comprised of the following materials: Ti, Hf, Cr, Al, Mo, W, Au, etc. For example, the n-electrode 1201 may be comprised of Ti—Al—Pt—Au (with a thickness of 30-100-30-500 nm), but is not limited to those materials. The deposition of these materials may be performed by electron beam evaporation, sputter, thermal heat evaporation, etc.

Facets

FIGS. 13(a)-13(b) and 14(a)-14(b) illustrate the method of making facets for a laser diode device.

FIG. 13(a) shows the no-growth region 107, the ELO GaN-based layer 106, and the etching region 117, based on the growth restrict mask 102 of FIG. 3(a). FIG. 13(b) is an enlarged view of the circled portion of FIG. 13(a), and shows a ridge stripe structure 1301, etched mirror region 1302 and chip scribe line 1303, on the ELO GaN-based layer 106 in FIG. 13(a). The etched mirror region 1302 is located based on optical resonance length, as is the chip scribe line 1303.

FIG. 14(a) shows the island-like semiconductor layers 119 bonded to the support substrate 1001. FIG. 14(b) is an enlarged view of the circled portion of FIG. 14(a), and shows a ridge stripe structure 1301, etched mirror region 1302 and chip scribe line 1303, on the island-like semiconductor layers 119 in FIG. 14(b). The etched mirror region 1302 is located based on optical resonance length, as is the chip scribe line 1303.

The etching process for GaN etching uses an Ar ion beam and $Cl_2$ ambient gas. The etching depth is from about 1 μm to about 4 μm. The etched mirror facet may be coated by a dielectric film selected from the group of the following: $SiO_2$, $Al_2O_3$, AlN, AlON, SiN, SiON, $TiO_2$, $Ta_2O_5$, $Nb_2O_5$, $Zr_2O$, etc.

Chip Division

FIGS. 13(a)-13(b) and 14(a)-14(b) also illustrate the chip division method.

The chip division method has two steps. The first step is to scribe the island-like semiconductor layers 119. The second step is to divide the support substrate 1001 using a laser scribe, etc.

As shown in both FIGS. 13(b) and 14(b), the chip scribe line 1303 is fabricated by a diamond scribing machine or laser scribe machine. The chip scribe line 1303 is fabricated on the back side of the island-like semiconductor layers 119. The chip scribe line 1303 may be a solid line or a dashed line.

Next, the support substrate 1001 is divided by laser scribing as well to obtain a laser diode device. It is better to avoid the ridge strip structure 1301 when the chip scribe line 1303 is fabricated.

Process Steps

Figure 15:
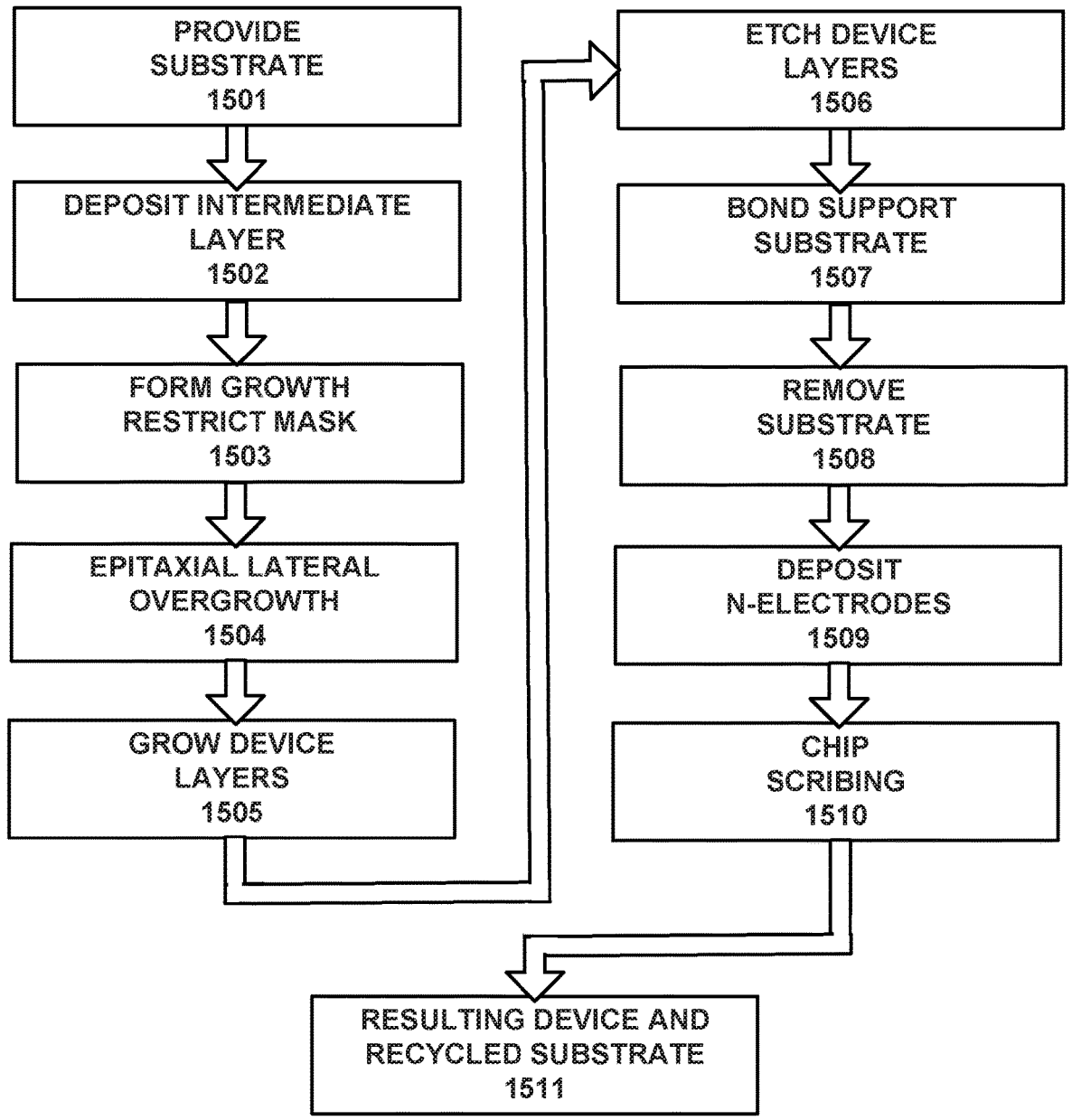
FIG. 15 is a flowchart illustrating the steps and functions of the present invention, according to one embodiment.

FIG. 15 is a flowchart that illustrates the method of removing GaN-based substrates from GaN-based semiconductor layers, after forming devices from the GaN-based semiconductor layers, so that the GaN-based substrates can be recycled, according to one embodiment of the present invention.

Block 1501 represents the step of providing a base substrate 101. In one embodiment, the base substrate 101 is a III-nitride-based substrate 101, such as a GaN-based substrate 101.

Block 1502 represents an optional step of depositing an intermediate layer 103 on the substrate 101. In one embodiment, the intermediate layer 103 is a III-nitride-based layer 103, such as a GaN-based layer 103.

Block 1503 represents the step of forming a growth restrict mask 102 on or above the substrate 101, i.e., on the substrate 101 itself or on the intermediate layer 103. The growth restrict mask 102 is patterned to include a plurality of stripes 104 and opening areas 105.

Block 1504 represents the step of growing one or more semiconductor layers 106 on or above the growth restrict mask 102 using epitaxial lateral overgrowth (ELO), wherein the epitaxial lateral growth of the semiconductor layers 106 extends in a direction parallel to the opening areas 105 of the growth restrict mask 102, and the epitaxial lateral overgrowth is stopped before the semiconductor layers 106 coalesce on the stripes 104. In one embodiment, the ELO layer 106 is an ELO III-nitride-based layer 106, such as an ELO GaN-based layer 106.

Block 1505 represents the step of growing one or more semiconductor device layers 108 on the ELO layer 106. These device layers 108, along with the ELO layer 106, create one or more of the island-like semiconductor layers 119.

Block 1506 represents the step of etching at least a portion of the semiconductor device layers 108 in the etching region 117 to remove the etched portion of the semiconductor device layers 108 and expose at least a portion of the growth restrict mask 102. The etching may include etching at least a portion of the device layers 108 above an opening area 105 of the growth restrict mask 102, and may continue below the surface of the substrate 101. The etching may also include removing a layer bending region 118 from the semiconductor layers 108.

Block 1507 represents the step of bonding the island-like semiconductor layers 119 to a support substrate 1001. The island-like semiconductor layers 119 are flip-chip bonded to a support substrate 1001 with metal or solder 1002 deposited thereon using metal-metal bonding or soldering techniques.

Block 1508 represents the step of at least partially dissolving the growth restrict mask 102 by etching to remove the substrate 101 from the island-like semiconductor layers 119. The growth restrict mask 102 is at least partially removed by the etching, which lifts off the substrate 101 from the island-like semiconductor layers 119. Further, the island-like semiconductor layers 119 may be peeled from the substrate 101.

Block 1509 represents the step of depositing n-electrodes on the back side of the island-like semiconductor layers 119, which is exposed by the lift-off of the substrate 101.

Block 1510 represents the step of chip scribing to separate the devices. This step may also include the etching of facets for laser diode devices.

Block 1511 represents the resulting product of the method, namely, one or more III-nitride-based semiconductor devices fabricated according to this method, as well as a substrate 101 that has been removed from the devices and is available for recycling and reuse.

Advantages and Benefits

The present invention provides a number of advantages and benefits:

Expensive III-nitride-based substrates 101 can be reused after the substrates 101 are removed from the device layers 108.

High quality device layers 108 may be obtained using a substrate 101 of the same or similar materials, with a very low defect density.

Using the same or similar materials for both the substrate 101 and the device layers 108 can reduce the strain in the device layers 108.

Using materials with the same or similar thermal expansion for both the substrate 101 and the device layers 108 can reduce bending of the substrate 101 during epitaxial growth.

Slicing the substrate 101 from a bulk crystal with a mis-cut orientation maintains the uniformity of thickness between the device layers 108 and produces a higher yield.

Layers 106 grown by ELO are of high quality.

The ELO layers 106 do not coalesce with each other, and internal strain is released, which helps to avoid any occurrences of cracks. For device layers 108 that are AlGaN layers, this is very useful, especially in the case of high Al content layers.

The island-like semiconductor layers 119 are formed in isolation, so tensile stress or compressive stress does not fall upon other island-like semiconductor layers 119.

Also, the growth restrict mask 102 and the ELO layers 106 are not bonded chemically, so the stress in the ELO layers 106 and device layers 108 can be relaxed by a slide caused at the interface between the growth restrict mask 102 and the ELO layers 106.

The existence of the no-growth regions 107 between each of the island-like semiconductor layers 119 provides flexibility, and the substrate 101 is easily deformed when external force is applied and can be bended.

Therefore, even if there occurs a slight warpage, curvature, or deformation in the substrate 101, this can be easily corrected by a small external force, to avoid the occurrence of cracks. As a result, the handling of the substrates 101 by vacuum chucking is possible, which makes the manufacturing process of the semiconductor devices more easily carried out.

The no-growth region 107 makes it is easy to dissolve a large area of the growth restrict mask 102.

Device layers 108 of high quality semiconductor crystal can be grown by suppressing the curvature of the substrate 101, and further, even when the device layers 108 are very thick, the occurrences of cracks, etc., can be suppressed, and thereby a large-area semiconductor device can be easily realized.

Thermal management of the devices improve significantly due to the flip-chip bonding on the support substrate.

The chip size is reduced by about 10 times when compared to the commercially available devices.

The fabrication method can also be easily adopted to large size wafers (>2 inches).

Modifications and Alternatives

A number of modifications and alternatives can be made without departing from the scope of the present invention.

Specifically, the III-nitride-based substrates may be basal c-plane {0001}; nonpolar a-plane {1 1 –2 0} and m-plane {1 0 –1 0} families; and semipolar plane families that have at least two nonzero h, i, or k Miller indices and a nonzero l Miller index, such as the {2 0 –2 –1} planes. Semipolar substrates of (20-2-1) are especially useful, because of the wide area of flattened ELO growth, which is very difficult to obtain with sapphire substrates.

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of removing a substrate, comprising:
   removing a portion of one or more III-nitride-based semiconductor layers on or above opening areas in growth restrict masks by etching at the opening areas to expose at least a portion of the growth restrict masks, the one or more III-nitride-based semiconductor layers grown from the opening areas on or above the substrate by epitaxial lateral overgrowth (ELO), the ELO stopped before the one or more III-nitride-based semiconductor layers coalesce with adjacent III-nitride-based semiconductor layers, the opening areas formed between the growth restrict masks, the growth restrict masks formed on or above the substrate; and
   removing the substrate from the one or more III-nitride-based semiconductor layers, wherein an interface between the one or more III-nitride-based semiconductor layers and the substrate remains at both edges of the opening areas in the growth restrict masks after the etching to hold the one or more III-nitride-based semiconductor layers, such that the one or more III-nitride-based semiconductor layers are easily removed from the substrate.

2. The method of claim 1, wherein, after removing the substrate, each of the one or more III-nitride-based semiconductor layers is at least a part of a device.

3. The method of claim 2, wherein a support substrate is used to remove the substrate.

4. The method of claim 3, wherein the support substrate is divided to form the device.

5. The method of claim 1, wherein the removing the substrate comprises separating the one or more III-nitride-based semiconductor layers from the substrate completely.

6. The method of claim 1, wherein the substrate is a III-nitride based substrate.

7. The method of claim 1, further comprising removing at least a layer bending region from the one or more III-nitride-based semiconductor layers.

8. The method of claim 7, wherein the at least a layer bending region includes at least a bended part of the one or more III-nitride-based semiconductor layers.

9. The method of claim 7, wherein the at least a layer bending region is located at an edge of the one or more III-nitride-based semiconductor layers.

10. The method of claim 7, wherein the at least a layer bending region includes at least a bended active region.

11. The method of claim 10, wherein the at least a bended active region is at least a bended InGaN/GaN multiple quantum well (MQW) active region.

12. The method of claim 1, wherein after the removing the substrate, the substrate is recycled.

13. The method of claim 1, wherein an interface between the growth restrict masks and the one or more III-nitride semiconductor layers is flat.

14. The method of claim 1, wherein the removing the portion of the one or more III-nitride-based semiconductor layers on or above the opening areas by etching to expose the at least a portion of the growth restrict masks comprises removing a part of the substrate.

15. The method of claim 14, wherein the part of the substrate is near both the portion of one or more III-nitride-based semiconductor layers and the at least a portion of the growth restrict masks.

16. The method of claim 1, wherein the one or more III-nitride-based semiconductor layers are separated from adjacent III-nitride-based semiconductor layers by non-growth regions.

17. The method of claim 1, wherein the one or more III-nitride-based semiconductor layers is divided into a plurality of island-shaped semiconductor layers after the removing the portion of one or more III-nitride-based semiconductor layers and the at least a part of growth restrict masks.

18. The method of claim 17, wherein the plurality of island-shaped semiconductor layers are separated from each other by no-growth regions and etching regions, the no-growth regions where the one or more III-nitride-based semiconductor layers are not grown on or above the substrate, the etching regions where the portion of one or more III-nitride-based semiconductor layers and the at least a part of growth restrict masks are removed.

* * * * *